United States Patent [19]

Aoki et al.

[11] Patent Number: 4,834,491

[45] Date of Patent: May 30, 1989

[54] SEMICONDUCTOR LASER MODULE OF DUAL IN-LINE PACKAGE TYPE INCLUDING COAXIAL HIGH FREQUENCY CONNECTOR

[75] Inventors: Satoshi Aoki, Chigasaki; Atsushi Murata, Yokohama, both of Japan

[73] Assignee: Hitachi, Ltd., Tokyo, Japan

[21] Appl. No.: 213,244

[22] Filed: Jun. 28, 1988

[30] Foreign Application Priority Data

Jul. 3, 1987 [JP] Japan .................... 62-165305

[51] Int. Cl.$^4$ .................... G02B 6/36; H01L 33/00; H01S 3/18; H03H 7/38
[52] U.S. Cl. .................... 350/96.20; 350/96.17; 350/96.10; 357/17; 357/19; 357/80; 357/81; 372/43; 439/63; 439/577; 439/581; 333/32
[58] Field of Search .................... 350/96.15, 96.17, 96.20, 350/96.10; 357/17, 19, 80, 81; 439/63, 577, 581; 372/43; 333/32, 123, 124

[56] References Cited

U.S. PATENT DOCUMENTS

| 4,003,074 | 1/1977 | Yonezu et al. | 357/19 |
| 4,167,744 | 9/1979 | Nyul | 357/17 |
| 4,296,998 | 10/1981 | Dufft | 350/96.20 |
| 4,379,273 | 4/1983 | Bender | 333/32 |
| 4,394,679 | 7/1983 | Hawrylo | 357/81 |
| 4,403,243 | 9/1983 | Hakamoda | 357/17 X |
| 4,538,276 | 8/1985 | Sequeira et al. | 357/17 X |
| 4,627,687 | 12/1986 | Dorn et al. | 350/96.20 |
| 4,761,788 | 8/1988 | Dietrich et al. | 357/17 X |

FOREIGN PATENT DOCUMENTS 62-112389 5/1987 Japan .................... 372/43 X

Primary Examiner—William L. Sikes
Assistant Examiner—Brian M. Healy
Attorney, Agent, or Firm—Fay, Sharpe, Beall, Fagan, Minnich & McKee

[57] ABSTRACT

A semiconductor laser module containing a semiconductor laser therein is disclosed, in which the insulated conductor of a coaxial-type high-frequency connector fixed to the outer wall suface of a dual in-line package is connected to an airtight terminal mounted on the package and connected electrically with the semiconductor laser in the package. Thus, a high-frequency signal in the giga bit band can be readily applied to the semiconductor laser through the coaxial-type high-frequency connector, without degrading the airtightness of the dual in-line package.

4 Claims, 1 Drawing Sheet

SEMICONDUCTOR LASER MODULE OF DUAL IN-LINE PACKAGE TYPE INCLUDING COAXIAL HIGH FREQUENCY CONNECTOR

BACKGROUND OF THE INVENTION

The present invention relates to a semiconductor laser module of the dual in-line package type suited to be used as a transmitting light source of a high-speed transmission system having a transmission rate of 1 Gb/sec or more.

In a conventional semiconductor laser module of the dual in-line package type, as described in a Japanese patent application JP-A-61-200,514 and the NEC technical Report (Vol. 38, No. 2, 1985, pages 84 through 89), an input terminal connected to a semiconductor laser is formed of one of airtight terminals of the dual in-line type. Such a structure is advantageous in that the semiconductor laser module can be readily mounted on a printed board or the like, but has a drawback that it is difficult to make short the length of the input terminal. Accordingly, the radiation leakage of a high-frequency signal is generated at the input terminal, and thus the frequency of an input signal applied to the semiconductor laser is limited. In other words, the conventional semiconductor laser module of the dual in-line package type pays no attention to the connection of the input terminal to a drive circuit which generates a high-frequency signal in the order of 1 Gb/sec (that is, in the giga bit band). Accordingly, the operation of the semiconductor laser module is not satisfactory in the giga bit band.

SUMMARY OF THE INVENTION

It is an object of the present invention to provide a semiconductor laser module of the dual in-line package type which is readily applied with a high-frequency signal and can perform a high-speed operation in the giga bit band, while keeping an advantage that a dual in-line package can be readily mounted on a printed board.

In order to attain the above object, according to the present invention, an airtight terminal connected to a semiconductor laser is connected to a coaxial-type high-frequency connector fixed to a dual in-line package.

In more detail, the insulated conductor of a coaxial-type high-frequency connector fixed to an outer wall surface of a dual in-line package, is connected to an airtight terminal which is mounted on the dual in-line package and connected to a semiconductor laser. Thus, a high-frequency signal in the giga bit band can be readily applied to the semiconductor laser through the coaxial-type high-frequency connector, without degrading the airtightness of the dual in-line package.

DESCRIPTION OF THE PREFERRED EMBODIMENTS

Now, explanation will be made of embodiments of a semiconductor laser module of the dual in-line package type according to the present invention, with reference to FIGS. 1 to 3.

Figure 1:
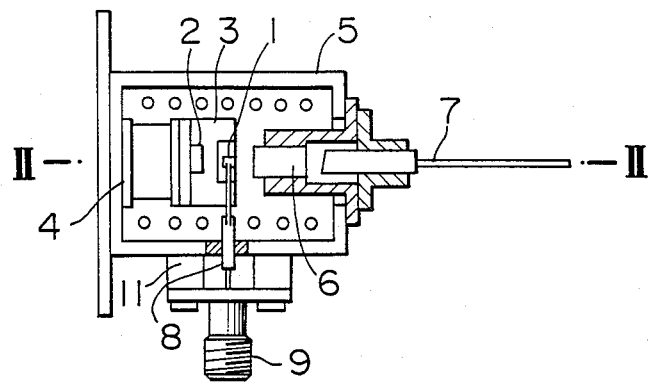
FIG. 1 is a plan view of an embodiment of a semiconductor laser module of the dual in-line package type according to the present invention, with parts cut away.
Figure 2:
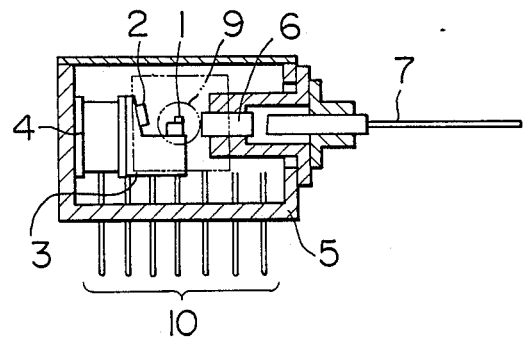
FIG. 2 is a sectional view taken along the line II—II of FIG. 1.

FIG. 1 is a plan view of one of the embodiments, with parts cut away, and FIG. 2 is a sectional view taken along the line II—II of FIG. 1.

Referring to FIGS. 1 and 2, a semiconductor laser 1 is mounted on a stem 3 made of oxygen-free copper, together with a monitoring photodiode 2 and a thermistor (not shown) for temperature detection. The stem 3 is fixedly mounted on an electronic cooling element 4 which is fixed to the inner wall surface of a dual in-line package 5. The terminals of parts which are not required to perform a high-speed operation, such as the monitoring photodiode 2, the thermistor for temperature detection, and the electronic cooling element 4 are connected to dual in-line terminals 10. One of the positive and negative electrodes of the semiconductor laser 1 is bonded, by the wire bonding method, to an airtight terminal 8 which penetrates the wall of the dual in-line package 5. The other electrode of the semiconductor laser 1 is connected to the stem 3. That portion of the wall surface of the dual in-line package 5 where the airtight terminal 8 exists, has a protrusion 11 for fixing a coaxial-type high-frequency connector 9 (for example, an SAM-type connector). The connector 9 is fixed to the protrusion 11 so that the insulated conductor of the connector 9 is connected with the airtight terminal 8. The stem 3 is connected to the dual in-line package proper.

According to the present embodiment, a high-frequency signal can be readily applied to the semiconductor laser 1 through the coaxial-type high-frequency connector 9. That is, the high-frequency signal is applied to the semiconductor laser 1 without passing through any one of the dual in-line terminals 10. Thus, the parasitic reactance of input terminal and the radiation leakage of high-frequency signal due to the electrical length of input terminal are both reduced so as to be out of the question. Accordingly, the present embodiment can readily perform a high-speed operation in the giga bit band. That is, according to the present embodiment, frequency response characteristics having a cut-off frequency more than 5 GHz are obtained, and moreover airtightness having a leakage rate less than $1 \times 10^{-8}$ atm cc/sec is obtained which is required to make reliable the operations of the semiconductor laser 1, the monitoring photodiode 2 and others.

In the present embodiment, the semiconductor laser 1 is optically coupled with an optical fiber 7 by means of a focusing rod lens 6. Alternatively, an optical fiber which is formed with a spherical shape so as to function as an optical lens may be substituted for the optical fiber 7, or one of a spherical lens, a convex lens and a combination of plural lens may be disposed between the semiconductor laser 1 and the optical fiber 7. Further, in the present embodiment, the SMA-type connector is used as the coaxial-type high-frequency connector 9. However, the coaxial-type high-frequency connector 9 is not limited to the SAM-type connector, but coaxial-type high-frequency connectors such as a BNC-type connector, an N-type connector and an APC-7 type connector may be used in place of the SAM-type connector. Further, a coaxial cable may be fixed to the protrusion 11 and connected to the airtight terminal 8, in place of the connector 9.

Figure 3:
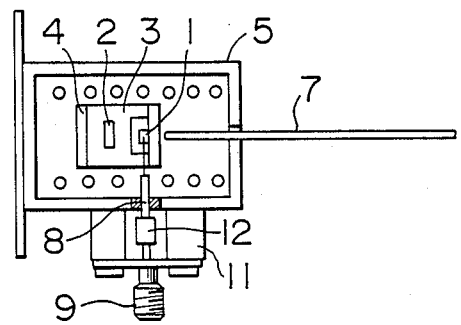
FIG. 3 is a plan view of another embodiment of a semiconductor laser module of the dual in-line package type according to the present invention.

FIG. 3 shows another one of the embodiments. In the present embodiment, an impedance matching circuit or a tip resistor 12 having a resistance of 43 ohms and serving as an impedance matching line is inserted and connected between the airtight terminal 8 and the coaxial-type high-frequency connector 9 to obtain the impedance matching between the semiconductor laser 1 and a drive circuit connected to the coaxial-type high-frequency connector 9. Thus, the reflection of input signal from the semiconductor laser 1 is suppressed, and a favorable result is obtained. In FIG. 3, the tip resistor 12 is used as the impedance matching means for the sake of simplicity. The tip resistor 12 may be replaced by a circuit for transmission line having a desired impedance. In this case, also, the present embodiment can perform an excellent high-speed operation in the given bit band.

As has been explained in the foregoing, a semiconductor laser module of the dual in-line package type according to the present invention can readily perform a high-speed operation in the giga bit band while keeping advantages that a dual in-line package is excellent in airtightness and can be readily mounted on a desired board or substrate.

We claim:

1. A semiconductor laser module of the dual in-line package type comprising:
   a semiconductor laser disposed within a dual in-line package;
   an optical fiber coupled optically with the semiconductor laser and extended to the outside of the package;
   an airtight terminal connected electrically with the semiconductor laser; and
   a coaxial-type high-frequency connector fixed to the package and connected electrically with the airtight terminal.

2. A semiconductor laser module of the dual in-line package type according to claim 1, wherein one of a circuit and a transmission line each having a desired impedance is disposed and connected between the coaxial-type high-frequency connector fixed to the dual in-line package and the airtight terminal connected to the semiconductor laser.

3. A semiconductor laser module of the dual in-line package type according to claim 1, wherein the semiconductor laser is fixedly disposed over an electronic cooling element which is disposed within and fixed to the dual in-line package.

4. A semiconductor laser module of the dual in-line package type comprising:
   a stem mounted with a semiconductor laser and a monitoring photodiode;
   an electronic cooling element fixed to the inner wall surface of a dual in-line package and mounted with the stem;
   dual in-line terminals of the package connected electrically with the monitoring photodiode and the electronic cooling element;
   an optical fiber connected optically with the semiconductor laser and extended to the outside of the package;
   an airtight terminal mounted on the package and connected electrically with the semiconductor laser; and
   a coaxial-type high-frequency connector fixed to the package and connected electrically with the airtight terminal.

* * * * *